United States Patent
Nomiya

(10) Patent No.: US 8,541,694 B2
(45) Date of Patent: Sep. 24, 2013

(54) MULTILAYER WIRING BOARD

(75) Inventor: Masato Nomiya, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 359 days.

(21) Appl. No.: 12/542,736

(22) Filed: Aug. 18, 2009

(65) Prior Publication Data

US 2009/0294167 A1   Dec. 3, 2009

Related U.S. Application Data

(63) Continuation of application No. PCT/JP2008/052849, filed on Feb. 20, 2008.

(30) Foreign Application Priority Data

Mar. 1, 2007   (JP) .................................. 2007-052114

(51) Int. Cl.
   *H05K 1/00*   (2006.01)
(52) U.S. Cl.
   USPC ........................... 174/264; 174/255; 174/262
(58) Field of Classification Search
   USPC ........................................................ 174/264
   See application file for complete search history.

(56) References Cited

U.S. PATENT DOCUMENTS

| | | | |
|---|---|---|---|
| 4,464,420 A | | 8/1984 | Taguchi et al. |
| 4,487,993 A | * | 12/1984 | Becker .......................... 174/264 |
| 4,641,425 A | | 2/1987 | Dubuisson et al. |
| 4,910,643 A | | 3/1990 | Williams |
| 6,335,076 B1 | * | 1/2002 | Nakamura et al. ............. 428/131 |
| 6,798,121 B2 | * | 9/2004 | Nakatani et al. .............. 310/340 |
| 6,815,046 B2 | * | 11/2004 | Mandai et al. ................ 428/210 |

FOREIGN PATENT DOCUMENTS

| | | |
|---|---|---|
| EP | 1 033 749 A2 | 9/2000 |
| JP | 2000-315864 A | 11/2000 |
| JP | 2001-160681 A | 6/2001 |

OTHER PUBLICATIONS

Official Communication issued in International Patent Application No. PCT/JP2008/052849, mailed on Mar. 18, 2008.
Official Communication issued in corresponding European Patent Application No. 08711655.4, mailed on Nov. 23, 2010.

* cited by examiner

Primary Examiner — William H Mayo, III
Assistant Examiner — Hiram E Gonzalez
(74) Attorney, Agent, or Firm — Keating & Bennett, LLP

(57) ABSTRACT

A multilayer wiring board is capable of preventing the occurrence of cracking in the vicinity of a connection portion of a conductor pattern disposed inside a basic material layer and a via-hole conductor even when the conductor pattern is connected to the via-hole conductor. A multilayer wiring board includes basic material layers and the constraining layers that are alternately stacked. In the material layer, a via-hole conductor is connected to an intermediate conductor pattern. An extended portion is defined by extending an end of the via-hole conductor beyond the intermediate conductor pattern inside the basic material layer.

7 Claims, 6 Drawing Sheets

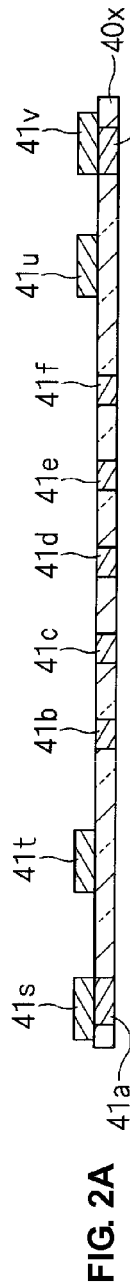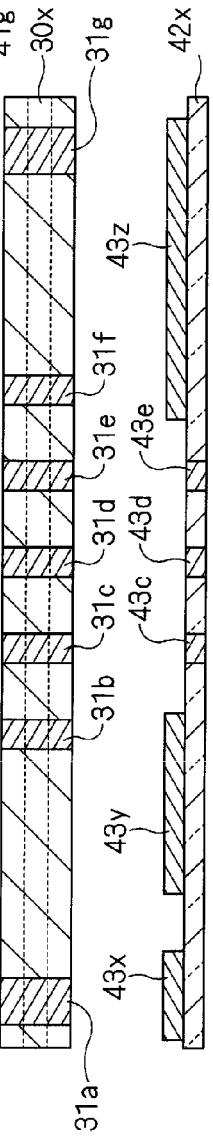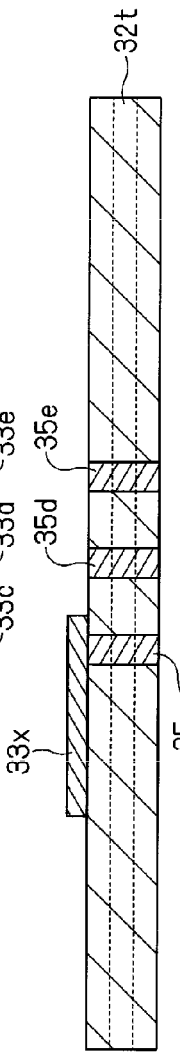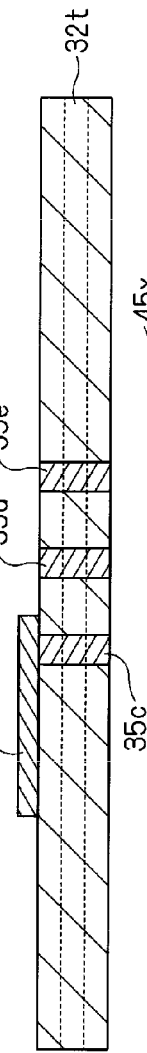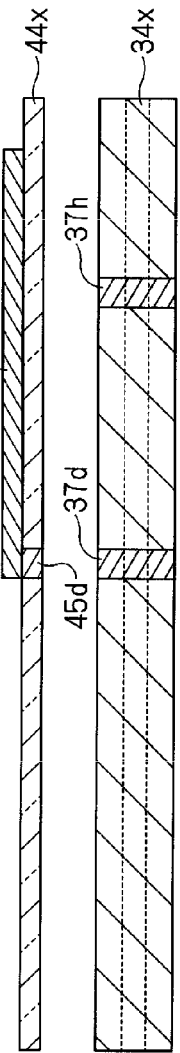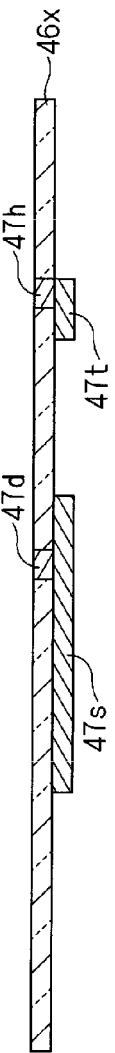

MULTILAYER WIRING BOARD

BACKGROUND OF THE INVENTION

1. Field of the Invention

The present invention relates to a multilayer wiring board and, in particular, to a multilayer wiring board including base material layers and constraining layers that are alternately stacked.

2. Description of the Related Art

In existing technology, as illustrated by a cross-sectional view in FIG. 7, a multilayer wiring board 110 has been produced by stacking and pressing constraining layers 103a to 103d, each sandwiched between neighboring glass ceramic green sheet groups 102a to 102e, each including at least one layer. The glass ceramic green sheet groups 102a to 102e define basic material layers. The constraining layers 103a to 103d are made of an inorganic composition that is not sintered under a firing condition of the glass ceramic green sheet groups 102a to 102e. A conductor pattern defining one of internal electrodes 105a to 105d or one of external electrodes 107 and 108 is provided on a surface of one of the glass ceramic green sheet groups 102a to 102e and the constraining layers 103a to 103d. Through-holes that pass through the glass ceramic green sheet groups 102a to 102e are filled with conductive materials defining via-hole conductors 104a to 104e, respectively. Subsequently, the glass ceramic green sheet groups 102a to 102e are fired. In the multilayer wiring board 110, the constraining layers 103a to 103d negligibly contract during firing. Accordingly, contraction of the glass ceramic green sheet groups 102a to 102e in the surface direction is constrained by the constraining layers 103a to 103d. Consequently, separation and cracking occurring at the interfaces between the glass ceramic green sheets can be prevented (refer to, for example, Japanese Unexamined Patent Application Publication No. 2000-315864).

In the multilayer wiring board having such a structure, for example, as illustrated by an enlarged cross-sectional view of a main portion shown in FIG. 8, when a conductor pattern 116 is disposed on a surface of a constraining layer 120 or a basic material layer 130 and a wiring electrode 117 used for a required connection is disposed in a basic material layer 132 (in the middle of the basic material layer 132) located between constraining layers 120 and 122, and if one end of a via-hole conductor 114 is connected to the wiring electrode 117, cracking 115 may occur in the basic material layer 132 in the vicinity of an end 114x of the via-hole conductor 114, that is, in the vicinity of a connection portion between the via-hole conductor 114 and the wiring electrode 117.

The cracking 115 occurs because, although contraction of portions of the basic material layer 132 in contact with the constraining layers 120 and 122 in the surface direction is sufficiently prevented during a firing process, portions remote from the constraining layers 120 and 122 are not sufficiently constrained by the constraining layers 120 and 122. Accordingly, the portions remote from the constraining layers 120 and 122 also contract in the surface direction. That is, when the via-hole conductor 114 is disposed in the basic material layer 132 and if the via-hole conductor 114 extends to the middle of the basic material layer 132, a complicated contraction force that pulls the basic material layer 132 is exerted against a portion in the vicinity of the end 114x of the via-hole conductor 114. As a result, cracking that begins at the end 114x of the via-hole conductor 114 occurs in the vicinity of the wiring electrode 117. The cracking that occurs in the vicinity of the wiring electrode 117 decreases the reliability of wiring of the multilayer wiring board. If the wiring electrode 117 is not disposed in the basic layer in order to prevent the occurrence of cracking, the wiring efficiency of the multilayer wiring board decreases.

SUMMARY OF THE INVENTION

To overcome the problems described above, preferred embodiments of the present invention provide a multilayer wiring board capable of preventing a decrease in the reliability of wiring caused by cracking even when a conductor pattern and a via-hole conductor disposed inside a basic material layer (for example, in the middle of the basic material layer) located between constraining layers are connected to each other.

A multilayer wiring board according to a preferred embodiment of the present invention includes at least one basic material layer and at least one constraining layer that are alternately stacked, a conductor pattern disposed on or inside the basic material layer or the constraining layer, wherein the conductor pattern extends in a surface direction in which the basic material layer and the constraining layer extend, and a via-hole conductor extending inside at least the basic material layer in a direction in which the basic material layer and the constraining layer are stacked, wherein the via-hole conductor is connected to the conductor pattern. The via-hole conductor includes a via body and an extended portion, the via body is connected to an intermediate conductor pattern disposed inside the basic material layer among the conductor patterns, and the extended portion is defined by extending the via body in a direction towards the constraining layer and away from the via body, and the extended portion is connected to the intermediate conductor pattern.

One end of the via-hole conductor connected to the intermediate conductor pattern disposed inside the basic material layer is preferably extended to the intermediate conductor pattern so that a via body is defined. Accordingly, the end of the via-hole conductor terminates at a location (i.e., a middle location) inside the basic material layer. However, in the above-described structure, an extended portion is arranged so that the via-hole conductor extends completely through the basic material layer and reaches the constraining layer. The extended portion of the via-hole conductor allows two via-hole conductor portions to be disposed on either side of the intermediate conductor pattern in the basic material layer. Accordingly, during firing, the contraction behaviors of the ceramic green sheet that define the basic material layer on either side of the intermediate conductor pattern are substantially the same. Thus, the difference between the contraction behaviors is significantly reduced. As a result, the occurrence of cracking in the vicinity of a connection portion between the via-hole conductor and the intermediate conductor pattern can be prevented.

Preferably, the extended portion of the via-hole conductor is in contact with the constraining layer.

If the extended portion of the via-hole conductor is in contact with the constraining layer, the extended portion is also supported by the constraining layer. Accordingly, contraction of the extended portion in the plane direction can be constrained. As a result, the occurrence of cracking beginning at the extended portion can be prevented.

More specifically, the multilayer wiring board can be configured so as to have the following various structures.

Preferably, the extended portion of the via-hole conductor extends completely through the constraining layer.

In such a case, the location of the via-hole conductor can be reliably maintained by the constraining layer. Thus, a precision-made multilayer wiring board can be provided.

Preferably, an end surface of the extended portion of the via-hole conductor is in contact with the constraining layer.

In such a case, the distance between the intermediate conductor pattern and the constraining layer can be maintained by the extended portion of the via-hole conductor. Accordingly, a precision-made multilayer wiring board can be produced. In particular, if a surface of the basic material layer having the via-hole conductor provided therein and the end surface of the extended portion of the via-hole conductor are substantially coplanar, the structure of the constraining layer can be simplified.

Preferably, the extended portion of the via-hole conductor is arranged so as to be coaxial with the via body.

In such a case, the contraction force can be evenly exerted against the two portions on either side of the intermediate conductor pattern. Accordingly, the occurrence of cracking can be easily prevented.

In addition, preferably, the diameter of the extended portion of the via-hole conductor is the same or substantially the same as the diameter of the via body.

In such a case, the difference between the contraction behaviors on either side of the intermediate conductor pattern is negligible. Thus, the occurrence of cracking can be easily prevented.

Preferably, the thickness of the basic material layer having the intermediate conductor pattern therein is greater than the thickness of the other basic material.

For example, when the basic material layer having the intermediate conductor pattern therein is produced by bonding two ceramic green sheets separated by the intermediate conductor pattern which defines a boundary, the thickness of the basic material layer having the intermediate conductor pattern therein is greater than the thickness of the other sheet produced from only one ceramic green sheet group. Note that a ceramic green sheet group is preferably formed from a single ceramic green sheet or is formed by stacking and pressing a plurality of ceramic green sheets, for example.

As in the above-described structure, if one end of the via-hole conductor extends through the basic material layer, the contraction behaviors on either side of the intermediate conductor pattern can be made substantially the same. Accordingly, the occurrence of cracking in the vicinity of a connection portion between the via-hole conductor and the intermediate conductor pattern can be prevented.

According to various preferred embodiments of the present invention, even when a conductor pattern disposed inside a basic material layer is connected to a via-hole conductor, the occurrence of cracking in the vicinity of a connection portion between the via-hole conductor and the conductor pattern can be prevented. As a result, the wiring efficiency of the multilayer wiring board can be increased.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 2A to 2H are cross-sectional views illustrating steps of manufacturing the multilayer wiring board according to the first preferred embodiment of the present invention.

DETAILED DESCRIPTION OF PREFERRED EMBODIMENTS

Various preferred embodiments of the present invention are described below with reference to FIGS. 1 to 6.

First Preferred Embodiment

A multilayer wiring board according to a first preferred embodiment of the present invention is described with reference to FIGS. 1 to 4.

Figure 3:
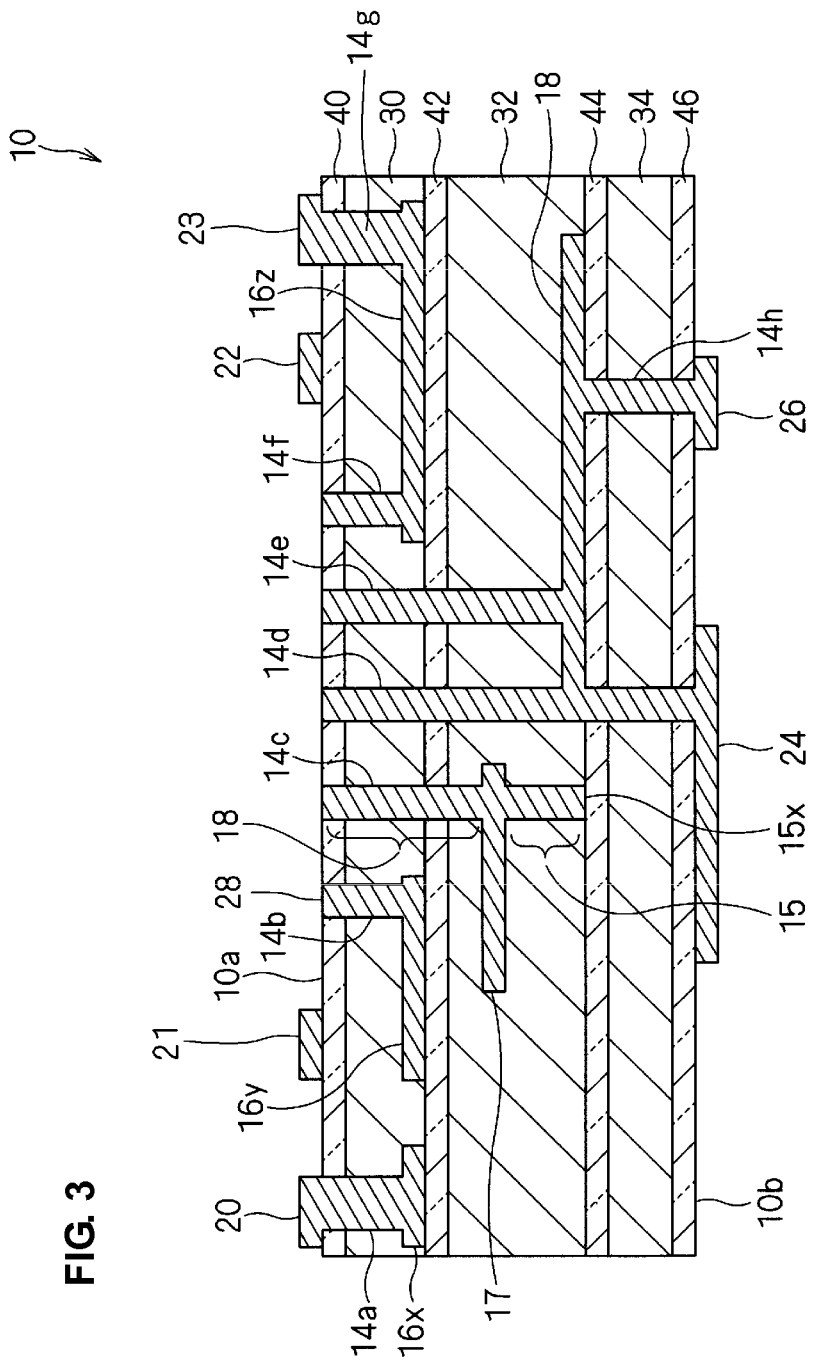
FIG. 3 is a cross-sectional view of the multilayer wiring board according to the first preferred embodiment of the present invention.

As shown by a cross-sectional view of FIG. 3, a multilayer wiring board 10 preferably includes alternately stacked basic material layers 30, 32, and 34 and constraining layers 40, 42, 44, and 46. Conductor patterns 16$x$, 16$y$, 16$z$, and 18 and conductor patterns 20 to 26 that extend in the surface direction of the basic material layers 30, 32, and 34 and the constraining layers 40, 42, 44, and 46 are provided on surfaces of the basic material layers 30, 32, and 34 or surfaces of the constraining layers 40, 42, 44, and 46. In addition, a conductor pattern (an intermediate conductor pattern) 17 is disposed inside the basic material layer 32.

Ends of the via-hole conductors 14$a$ to 14$h$ are connected to the conductor patterns 16$x$, 16$y$, 16$z$, 18, 20 and the conductor patterns 23 to 26. The via-hole conductors 14$a$ to 14$h$ extend in a direction in which the basic material layers 30, 32, and 34 and the constraining layers 40, 42, 44, and 46 are stacked. In particular, the via-hole conductor 14$c$ is connected to the intermediate conductor pattern 17 disposed inside the basic material layer 32. An end of a via body 18 of the via-hole conductor 14$c$ connected to the intermediate conductor pattern 17 is extended towards the constraining layer 44. Thus, an extended portion 15 that passes beyond the intermediate conductor pattern 17 and reaches the constraining layer 44 is provided.

By providing the extended portion 15 of the via-hole conductor 14$c$, the basic material layer 32 includes the via body 18 and the extended portion 15 of the via-hole conductor 14$c$ disposed on either side of the intermediate conductor pattern 17. Accordingly, during firing, contraction behaviors of two portions of the ceramic green sheet that defines the basic material layer 32 on either side of the intermediate conductor pattern 17 are substantially the same and, therefore, the difference between the contraction behaviors is decreased. Consequently, cracking occurring at a connection portion of the via-hole conductor 14$c$ and the intermediate conductor pattern 17 is prevented.

The extended portion 15 is preferably coaxial with the via body 18, for example. In addition, the extended portion 15 and the via body 18 preferably have the same or substantially the same diameter, for example. If the extended portion 15 is arranged to be coaxial with the via body 18, a contraction force can be evenly propagated to both sides of the intermediate conductor pattern 17 when the ceramic green sheet is fired. Accordingly, the occurrence of cracking is further easily prevented. In addition, if the extended portion 15 is arranged to have a diameter that is the same or substantially the same as that of the via body 18, the difference between the contraction behaviors on either side of the intermediate conductor pattern 17 is negligible when the ceramic green sheet is fired. Accordingly, the occurrence of cracking is further easily and reliably prevented.

Figure 4:
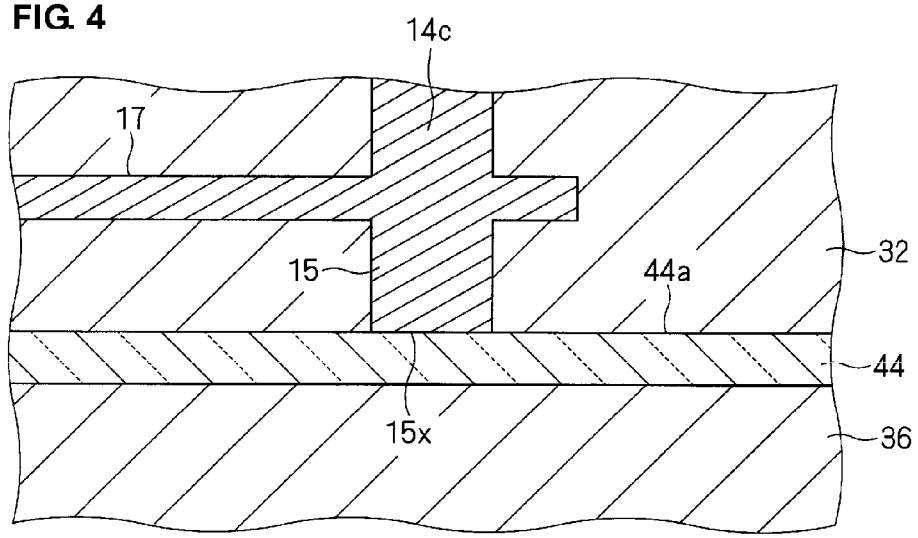
FIG. 4 is an enlarged cross-sectional view of a main portion of the multilayer wiring board according to the first preferred embodiment of the present invention.

As shown by a cross-sectional view of a main portion in FIG. 4, an end surface 15x of the extended portion 15 is preferably in contact with a surface 44a of the constraining layer 44 adjacent to the basic material layer 32 having the via-hole conductor 14c provided therein.

If the end surface 15x of the extended portion 15 of the via-hole conductor 14c is in contact with a surface 44a of the constraining layer 44, the extended portion 15 of the via-hole conductor 14c is also supported by the constraining layer 44. Accordingly, contraction of the extended portion 15 in the surface direction can be constrained and minimized. Consequently, the occurrence of cracking beginning at the extended portion 15 can be prevented. Since a surface of the basic material layer 32 having the via-hole conductor 14c provided therein and the end surface 15x of the extended portion 15 of the via-hole conductor 14c are preferably substantially coplanar, the structure of the constraining layer 44 can be simplified.

The thickness of the basic material layer 32 having the intermediate conductor pattern 17 provided therein may preferably be greater than the thickness of each of the other basic material layers 30 and 34. For example, when the basic material layer 32 having the intermediate conductor pattern 17 provided therein is produced by bonding two ceramic green sheet groups separated by the intermediate conductor pattern 17 defining a boundary, the thickness of the basic material layer having the intermediate conductor pattern 17 provided therein tends to be greater than the thickness of each of the other basic material layers 30 and 34 each being defined by a single ceramic green sheet group.

Figure 1:
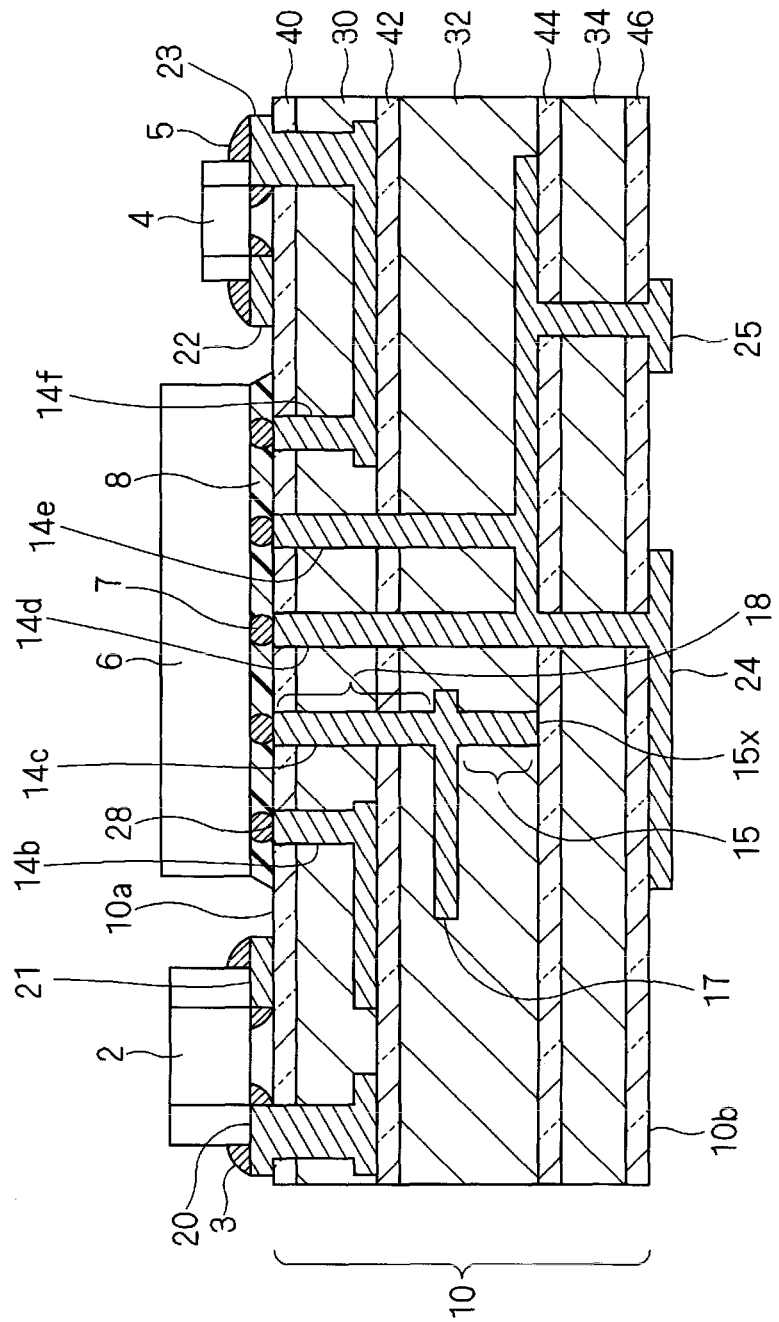
FIG. 1 is a cross-sectional view of a multilayer wiring board having components mounted thereon according to a first preferred embodiment of the present invention.

As shown by the cross-sectional view of FIG. 1, chip electronic components 2 and 4 are preferably connected, using solders 3 and 5, for example, to the conductor patterns 20 to 23 exposed at a top surface 10a of the multilayer wiring board 10. In addition, an IC chip 6 is preferably flip-chip bonded, using solder balls 7, for example, to end surfaces of the via-hole conductors 14b to 14f exposed at the top surface 10a of the multilayer wiring board 10. An underfill resin 8 is preferably filled between the IC chip 6 and the top surface 10a of the multilayer wiring board 10.

The conductor patterns 24 and 25 exposed at a bottom surface 10b of the multilayer wiring board 10 are preferably used as connection terminals that connect the multilayer wiring board 10 with another multilayer wiring board (not shown).

Each of the basic material layers 30, 32, and 34 is preferably formed by firing one or more ceramic green sheets including a first ceramic material. The basic material layers 30, 32, and 34 determine the board characteristics of the multilayer wiring board 10. Each of the constraining layers 40, 42, 44, and 46 is preferably formed by firing one or more ceramic green sheets including a second ceramic material.

It is preferable that the thickness of each of the basic material layers 30, 32, and 34 ranges from about 8 μm to about 100 μm after the green sheets is sintered, for example. The thickness of each of the basic material layers 30, 32, and is not limited to that range. However, it is preferable that the thickness of each of the basic material layers 30, 32, and be less than or equal to a maximum thickness of each of the constraining layers 40, 42, 44, and 46. The thicknesses of the basic material layers 30, 32, and 34 may differ from one another.

A ceramic material portion (e.g., a glass component) of which is impregnated in the constraining layers 40, 42, 44, and 46 during firing is preferably used as the first ceramic material. In addition, it is preferable that the first ceramic material be a low-temperature co-fired ceramic (LTCC) that can be fired at a relatively low temperature, for example, a temperature less than or equal to about 1050° C. More specifically, glass ceramic that is a mixture of alumina and borosilicate-based glass or Ba—Al—Si—O-based ceramic that generates a glass component during firing can preferably be used as the first ceramic material.

The second ceramic material is attached to a portion of the first ceramic material that interpenetrates from the basic material layers 30, 32, and 34. Accordingly, the constraining layers 40, 42, 44, and 46 are solidified. In addition, the basic material layers 30, 32, and 34 adjacent to the constraining layers 40, 42, 44, and 46 are connected to one another.

Alumina or zirconia is preferably used as the second ceramic material, for example. The constraining layers 40, 42, 44, and 46 preferably include the unsintered second ceramic material having a sintering temperature greater than that of the first ceramic material. Accordingly, during firing, the constraining layers 40, 42, 44, and 46 prevent contraction thereof in the surface direction with respect to the basic material layers 30, 32, and 34. In addition, as noted above, the constraining layers 40, 42, 44, and 46 are adhered and joined when a portion of the first ceramic material interpenetrates. Accordingly, it is preferable that the thickness of each of the constraining layers 40, 42, 44, and 46 is about 1 μm to about 10 μm after being sintered, for example, although, the thickness depends on the states of the constraining layers 40, 42, 44, and 46, a desired force of constraint, and a firing condition.

The material used for conductor portions of the conductor patterns and the via-hole conductors can preferably primarily include a conductive component that can be sintered at the same time as the basic material layers 30, 32, and 34. For example, a commonly known material can be used as the material of the conductor portions of the conductor patterns and the via-hole conductors. More specifically, Cu, Ag, Ni, Pd, an oxide thereof, or an alloy component thereof can preferably be used, for example. In the present preferred embodiment, the conductor portions primarily including Cu, for example, are preferably provided.

A method for manufacturing the multilayer wiring board 10 is described next.

As schematically shown by the cross-sectional view in FIGS. 2A to 2H, the following ceramic green sheet groups are prepared: a ceramic green sheet group 30x corresponding to the basic material layer 30 shown in FIG. 1, ceramic green sheet groups 32s and 32t corresponding to the basic material layer 32 shown in FIG. 1, a ceramic green sheet group 34x corresponding to the basic material layer 34 shown in FIG. 1, and ceramic green sheet groups 40x, 42x, 44x, and 46x corresponding to the constraining layers 40, 42, 44, and 46 shown in FIG. 1, respectively. For the basic material layer 32, the two ceramic green sheet groups 32s and 32t are prepared. For each of the other layers, a single ceramic green sheet group is prepared. Each of the ceramic green sheet groups 30x, 32s, 32t, 34x, 40x, 42x, 44x, and 46x is formed by pressing a single ceramic green sheet or stacking and pressing a plurality of ceramic green sheets. For example, one side of each of the ceramic green sheet groups 30x, 32s, 32t, 34x, 40x, 42x, 44x, and 46x is supported by a carrier film (not shown).

A through-hole is formed in each of the ceramic green sheet groups 30x, 32s, 32t, 34x, 40x, 42x, 44x, and 46x by using, for example, a die. Thereafter, a conductive paste is filled in the through-holes. In this manner, via-hole conductors 31a to 31g, via-hole conductors 33c to 33e, via-hole conductors 35c to 35e, via-hole conductors 37d and 37h, via-hole conductors 41a to 41g, via-hole conductors 43c to 43e, a via-hole conductor 45d, and via-hole conductors 47d and 47h are formed. In addition, conductive paste is printed on a surface of each of the ceramic green sheet groups 32t, 40x, 42x, 44x, and 46x so that a conductor pattern 33x, conductor patterns 41s to 41v, conductor patterns 43x to 43z, a conductor pattern 46x, and conductor patterns 47s and 47t are formed, respectively.

Subsequently, the generated ceramic green sheet groups 30x, 32s, 32t, and 34x and the generated ceramic green sheet groups 40x, 42x, 44x, and 46x are stacked and pressed in a predetermined order and in a predetermined direction. Thus, a ceramic green sheet compact is produced.

At this time, the conductor pattern 33x defining a wiring electrode is disposed between the ceramic green sheet groups 32s and 32t used to form the basic material layer 32. If, for the conductor pattern 33x defining the intermediate conductor pattern 17 (refer to FIGS. 1 and 3), the via-hole conductor 33c to be connected to the conductor pattern 33x is provided in the ceramic green sheet group 32s, the via-hole conductor 33c extending to the neighboring ceramic green sheet group 44x is also provided in a portion located at a substantially coaxial position when the ceramic green sheet group 32s is connected to the ceramic green sheet group 32t.

Note that, instead of preparing ceramic green sheet groups, stacking the ceramic green sheet groups, and forming a ceramic green sheet compact, the ceramic green sheets may preferably be pressed in an appropriate order so that a ceramic green sheet compact is formed.

Subsequently, the ceramic green sheet compact is fired in a predetermined atmosphere at a predetermined temperature. In this manner, the multilayer wiring board 10 as shown in FIG. 3 is produced. During firing, in the ceramic green sheet compact, the basic material layers 30, 32, and 34 tend to contract. However, the constraining layers 40, 42, 44, and 46 act to constrain the contraction of the basic material layers 30, 32, and 34. Thus, the multilayer wiring board 10 having outstanding dimensional precision can be manufactured.

In order to increase the integrity with a wall surface, conductive paste used for the via-hole conductors 31a to 31g, the via-hole conductors 33c to 33e, the via-hole conductors 35c to 35e, the via-hole conductors 37d and 37h, the via-hole conductors 41a to 41g, the via-hole conductors 43c to 43e, the via-hole conductor 45d, and the via-hole conductors 47d and 47h may preferably include glass of an amount that does not impair the conductivity and the surface treatment, for example. However, the composition of the conductive paste is not particularly limited to the above-described composition as long as the composition does not reduce the effects and advantages of preferred embodiments of the present invention.

The firing atmosphere can be appropriately changed in accordance with the type of the first ceramic material and the type of conductive particles included in a conductive paste film.

In a particular example, a Ba—Al—Si—O-based ceramic material was preferably used for the first ceramic material of the basic material layers 30, 32, and 34. Alumina was preferably used for the second ceramic material of the constraining layers 40, 42, 44, and 46. In addition, the thickness of each of the sintered basic material layers 30 and 34 was preferably set to about 20 μm, for example. The thickness of the sintered basic material layer 32 was preferably set to about 40 μm, for example. The thickness of each of the sintered constraining layers 40, 42, 44, and 46 was preferably set to about 3 μm, for example. Note that the thickness of the basic material layer 32 may be the same or substantially the same as that of the basic material layers 30 and 34 if a desired electrical characteristic and mechanical strength can be obtained.

As a comparative example, a multilayer wiring board similar to the particular example according to a preferred embodiment of the present invention described above was produced, except that the via-hole conductor 14c did not include the extended portion 15.

TABLE 1 shows the cracking occurrence rates of the particular example and the comparative example. The number of samples is 100 for both examples.

TABLE 1

|  | Cracking Occurrence Rate |
| --- | --- |
| Particular Example | 0% |
| Comparative Example | 90% |

As shown from the above-described results, cracking of the basic material layer 32 can be prevented even when the intermediate conductor pattern 17 is connected to the via-hole conductor 14c disposed inside the basic material layer 32. As a result, the multilayer wiring board 10 having an excellent wiring efficiency can be achieved.

Second Preferred Embodiment

A multilayer wiring board according to a second preferred embodiment of the present invention is described next with reference to FIG. 5. According to the second preferred embodiment, a multilayer wiring board has a structure substantially the same as that of the multilayer wiring board 10 of the first preferred embodiment. In the following description, portions that are different are primarily described. The same numbering will be used in the following description as was used above to describe the first preferred embodiment.

Figure 5:
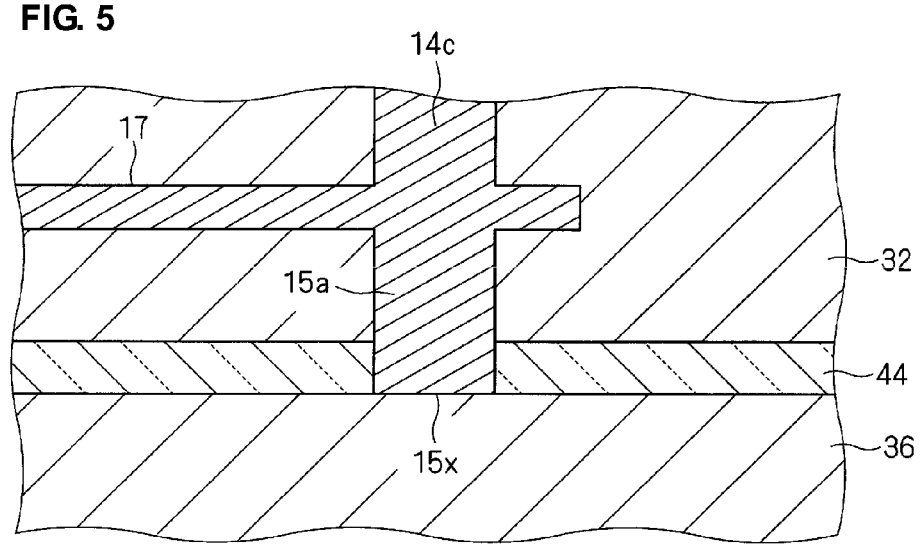
FIG. 5 is an enlarged cross-sectional view of a main portion of a multilayer wiring board according to a second preferred embodiment of the present invention.

As indicated by the enlarged view of a main portion in FIG. 5, unlike the first preferred embodiment illustrated in FIG. 3, the end surface 15x of an extended portion 15a of the via-hole conductor 14c is not in contact with the constraining layer 44. Instead, the end surface 15x passes through the constraining layer 44 and is in contact with a basic material layer 36 located on the other surface of the constraining layer 44.

In this case, the occurrence of cracking in the intermediate conductor pattern 17 can be prevented. In addition, the occurrence of cracking beginning at the extended portion 15a of the via-hole conductor 14c can be prevented. As a result, the reliability of the basic material layer 36 can be improved.

Third Preferred Embodiment

Figure 6:
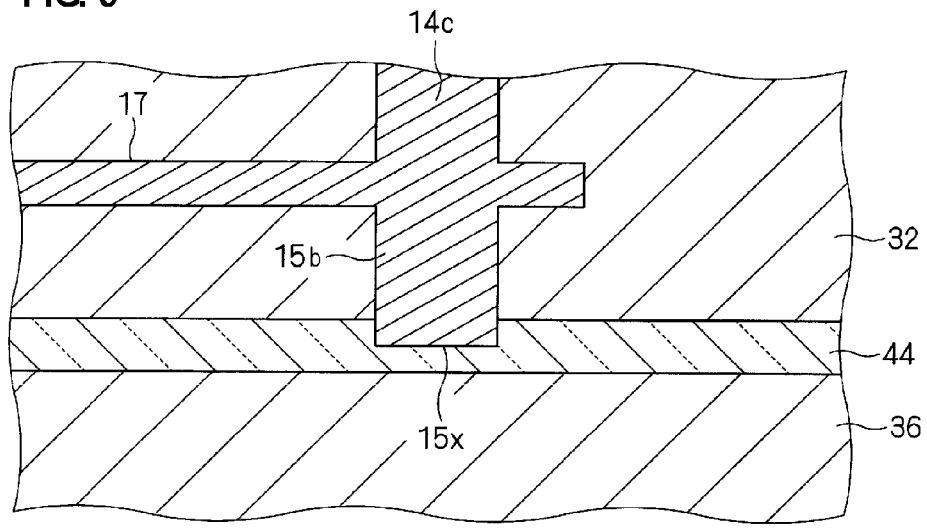
FIG. 6 is an enlarged cross-sectional view of a main portion of a multilayer wiring board according to a third preferred embodiment of the present invention.
Figure 7:
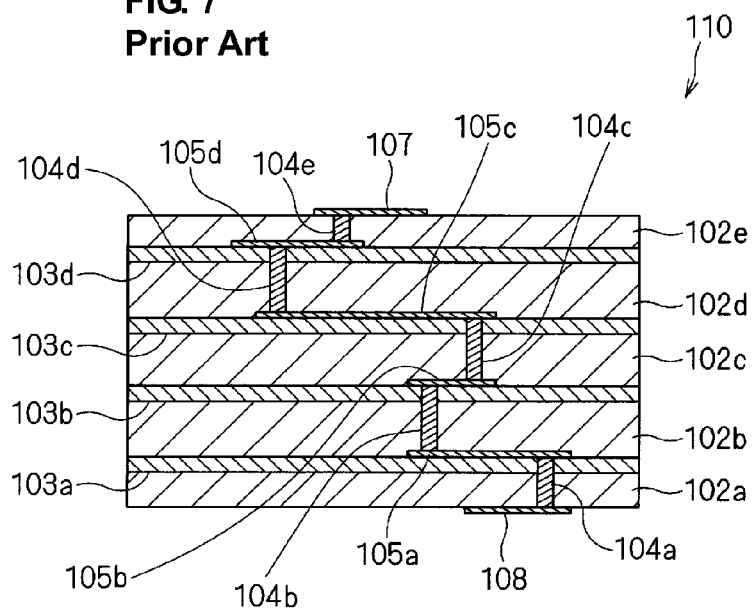
FIG. 7 is a cross-sectional view of a known multilayer wiring board.
Figure 8:
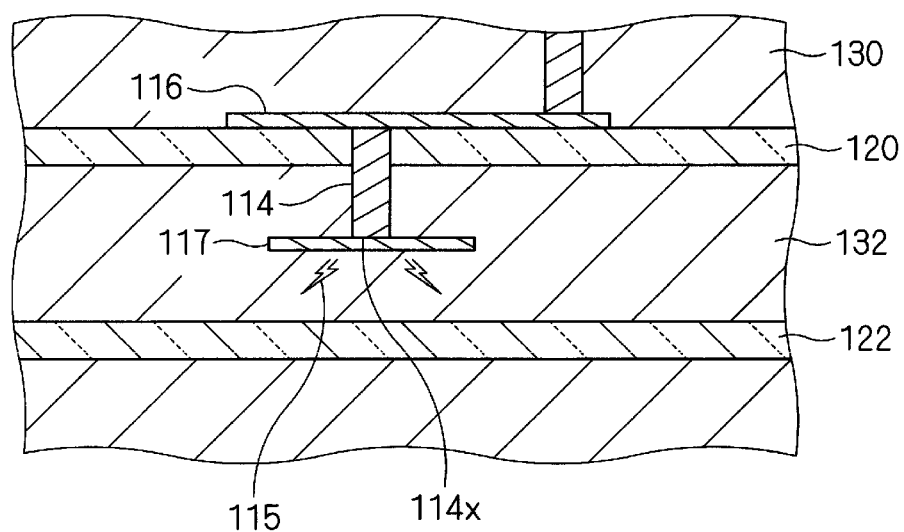
FIG. 8 is an enlarged cross-sectional view of a main portion of a known multilayer wiring board.

Similar the second preferred embodiment, as shown in FIG. 6, a multilayer wiring board of a third preferred embodiment of the present invention has a structure similar to that of the first preferred embodiment.

As indicated by the enlarged view of a main portion in FIG. 6, an extended portion 15b of the via-hole conductor 14c extends to a middle portion of the constraining layer 44. Such a structure can preferably be generated by, for example, forming the constraining layer 44 using a plurality of green sheets and stacking the green sheet including a through-hole filled with a conductive material and the green sheet including no through-hole. The through-hole filled with a conductive material corresponds to the extended portion 15*b* of the via-hole conductor 14*c*.

In this case, the occurrence of cracking in the intermediate conductor pattern 17 can be prevented. In addition, the occurrence of cracking beginning at the extended portion 15*b* of the via-hole conductor 14*c* can be prevented. As a result, the reliability of the basic material layer 36 can be improved.

As described above, the via-hole conductor 14*c* to be connected with the intermediate conductor pattern 17 disposed inside the basic material layer 32 is preferably extended beyond the intermediate conductor pattern 17 so that the extended portions 15, 15*a*, 15*b*, or 15*c* are provided. The extended portions 15, 15*a*, 15*b*, and 15*c* do not have electrical conductivity. However, when being fired, contraction behaviors of two portions of the ceramic green sheet that defines the basic material layer 32 on either side of the intermediate conductor pattern 17 can be made substantially the same and, therefore, cracking occurring at a connection portion of the intermediate conductor pattern and the via-hole conductor 14*c* and in the vicinity thereof can be prevented. As a result, the wiring efficiency of the multilayer wiring board can be increased.

It should be noted that the present invention is not limited to the above-described preferred embodiments. Many variations thereon can be made.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer wiring board comprising:
   at least one basic material layer and at least one constraining layer stacked on each other;
   a conductor pattern disposed on or inside at least one of the at least one basic material layer or the at least one constraining layer, the conductor pattern extending in a surface direction in which the at least one basic material layer and the at least one constraining layer extend; and
   a via-hole conductor extending inside at least the at least one basic material layer in a direction in which the at least one basic material layer and the at least one constraining layer are stacked, the via-hole conductor being connected to the conductor pattern; wherein
   the via-hole conductor includes a via body and an extended portion, the via body is connected to an intermediate conductor pattern disposed inside the at least one basic material layer such that portions of a single one of the at least one basic material layer are disposed on both sides of the intermediate conductor pattern in a stacking direction of the at least one basic material layer and the at least one constraining layer, and the extended portion is defined by the via body being extended in a direction towards the at least one constraining layer and away from the via body, and the extended portion is connected to the intermediate conductor pattern; and
   an end of the extended portion of the via-hole conductor is not directly electrically or physically connected to any conductor pattern and is in direct contact with a surface of the at least one constraining layer.

2. The multilayer wiring board according to claim 1, wherein the extended portion of the via-hole conductor extends completely through the at least one constraining layer.

3. The multilayer wiring board according to claim 1, wherein an end surface of the extended portion of the via-hole conductor is in contact with the at least one constraining layer.

4. The multilayer wiring board according to claim 1, wherein the extended portion of the via-hole conductor is arranged to be substantially coaxial with the via body.

5. The multilayer wiring board according to claim 4, wherein a diameter of the extended portion of the via-hole conductor is substantially the same as a diameter of the via body.

6. The multilayer wiring board according to claim 1, further comprising a plurality of basic material layers, wherein a thickness of at least one of the basic materials layer having the intermediate conductor pattern therein is greater than thicknesses of other ones of the basic material layers.

7. The multilayer wiring board according to claim 1, further comprising a plurality of basic material layers and a plurality of constraining layers that are alternately stacked on each other.

* * * * *